(12) United States Patent
Lee et al.

(10) Patent No.: US 11,735,118 B2
(45) Date of Patent: Aug. 22, 2023

(54) ORGANIC LIGHT EMITTING DISPLAY DEVICE AND DRIVING METHOD OF THE SAME

(71) Applicant: Samsung Display Co., Ltd., Yongin-si (KR)

(72) Inventors: Seung-Jun Lee, Hwaseong-si (KR); Geunjeong Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 54 days.

(21) Appl. No.: 16/235,297

(22) Filed: Dec. 28, 2018

(65) Prior Publication Data

US 2019/0206331 A1 Jul. 4, 2019

(30) Foreign Application Priority Data

Jan. 4, 2018 (KR) .................. 10-2018-0001369

(51) Int. Cl.
*G09G 3/3266* (2016.01)
*G09G 3/3275* (2016.01)
(Continued)

(52) U.S. Cl.
CPC ......... *G09G 3/3266* (2013.01); *G09G 3/3275* (2013.01); *G09G 2310/08* (2013.01);
(Continued)

(58) Field of Classification Search
CPC .......... G09G 3/3208–3291; G09G 2320/0626; G09G 2320/0673; G09G 3/3266; G09G 3/3275; G09G 2310/08; G09G 3/3233; G09G 2360/16; G09G 2330/021; G09G 2330/028; H10K 59/131
See application file for complete search history.

(56) References Cited

U.S. PATENT DOCUMENTS

2008/0187235 A1 8/2008 Wakazono et al.
2009/0002402 A1* 1/2009 Barnhoefer .......... G09G 3/3406
345/690
(Continued)

FOREIGN PATENT DOCUMENTS

CN 101166240 A 4/2008
CN 103973988 A 8/2014
(Continued)

*Primary Examiner* — Andrew Sasinowski
(74) *Attorney, Agent, or Firm* — Lewis Roca Rothgerber Christie LLP

(57) ABSTRACT

An organic light emitting display device includes: a display panel including a plurality of pixels; a power source configured to provide a high power voltage and a low power voltage to the pixels; a data driver configured to provide a data signal to the pixels through data lines; a scan driver configured to provide a scan signal to the pixels through scan lines; a timing controller configured to provide control signals that control the power source, the data driver, and the scan driver; and an image processor configured to receive an HDR image signal by every frame, calculate an on-pixel ratio (OPR) that represents a ratio of a number of the pixels that turn on based on the HDR image signal to the number of all pixels included in the display panel, and control a brightness of the pixels that turn on based on the on-pixel ratio.

20 Claims, 11 Drawing Sheets

(51) Int. Cl.
*H01L 27/32* (2006.01)
*H10K 59/131* (2023.01)

(52) U.S. Cl.
CPC ............... *G09G 2320/0626* (2013.01); *G09G 2320/0673* (2013.01); *H10K 59/131* (2023.02)

(56) References Cited

U.S. PATENT DOCUMENTS

| | | | |
|---|---|---|---|
| 2015/0091950 A1* | 4/2015 | Park | G09G 3/3291 345/690 |
| 2015/0213766 A1 | 7/2015 | Sugimoto | |
| 2015/0110356 A1 | 8/2015 | Qian et al. | |
| 2015/0341537 A1* | 11/2015 | Peng | H04N 5/2351 348/234 |
| 2015/0356904 A1* | 12/2015 | Nakatani | G09G 5/377 345/690 |
| 2016/0372057 A1* | 12/2016 | Katsu | G09G 3/2092 |
| 2017/0103707 A1* | 4/2017 | Park | G09G 3/2003 |
| 2017/0294156 A1* | 10/2017 | Pyo | G09G 3/2077 |
| 2018/0308434 A1* | 10/2018 | Nakanishi | G09G 3/36 |
| 2018/0336669 A1* | 11/2018 | Mertens | H04N 5/445 |
| 2019/0130834 A1* | 5/2019 | Cheon | G09G 3/2092 |
| 2019/0206331 A1* | 7/2019 | Lee | G09G 3/3233 |
| 2020/0135102 A1* | 4/2020 | Eun | G09G 3/3241 |

FOREIGN PATENT DOCUMENTS

| | | |
|---|---|---|
| JP | 2015-142276 A | 8/2015 |
| JP | 5911518 B2 | 4/2016 |
| KR | 10-2015-0058468 A | 5/2015 |
| KR | 10-2016-0097398 A | 8/2016 |
| KR | 10-2016-0121782 A | 10/2016 |
| KR | 10-2016-0125555 A | 11/2016 |
| KR | 10-2017-0037710 A | 4/2017 |
| KR | 10-2017-0052287 A | 5/2017 |
| KR | 10-2017-0107597 | 9/2017 |
| KR | 10-2018-0032750 | 4/2018 |

\* cited by examiner

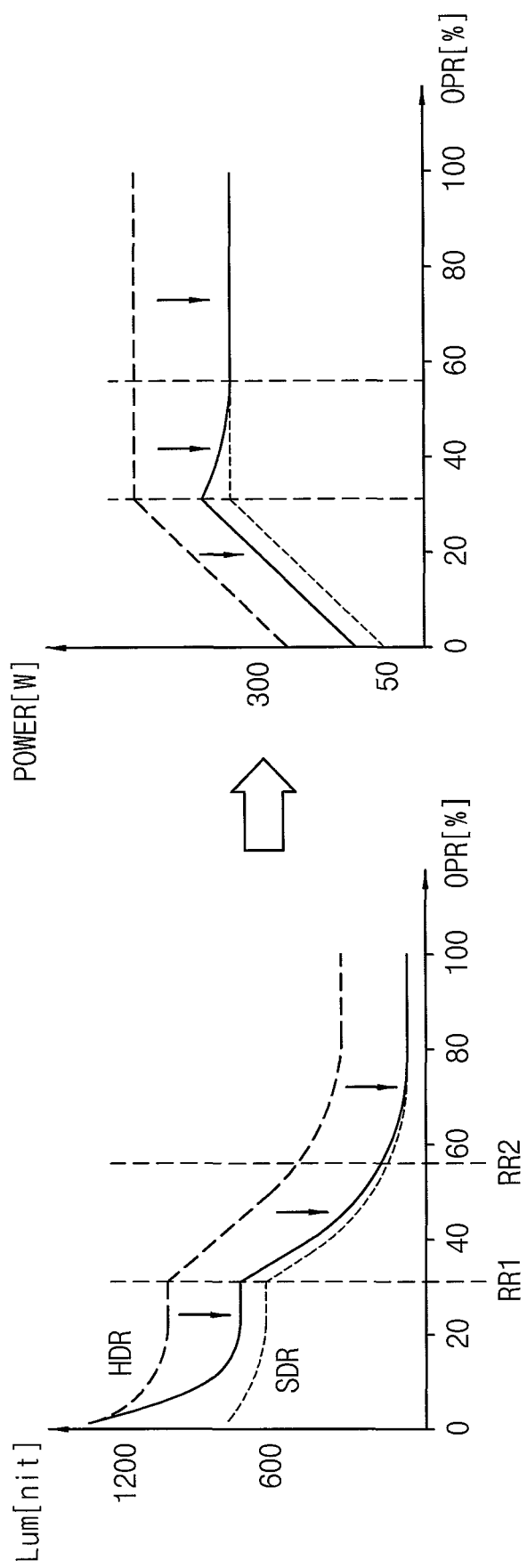

ORGANIC LIGHT EMITTING DISPLAY DEVICE AND DRIVING METHOD OF THE SAME

CROSS-REFERENCE TO RELATED APPLICATION

This application claims priority to and the benefit of Korean Patent Application No. 10-2018-0001369, filed on Jan. 4, 2018 in the Korean Intellectual Property Office (KIPO), the entire content of which is incorporated herein by reference.

BACKGROUND

1. Field

Aspects of some example embodiments relate generally to an organic light emitting display device and a driving method of the same.

2. Description of the Related Art

A high dynamic range (HDR) method may provide a natural image by analyzing a brightness and darkness of the image in detail. A high dynamic range image applied with the high dynamic range method may have a high contrast ratio by adjusting the brightness and a color. Power consumption of the high dynamic range image may increase comparing to a standard dynamic range (SDR) image because the high dynamic range image may have a relatively high brightness.

The above information disclosed in this Background section is only for enhancement of understanding of the background and therefore it may contain information that does not constitute prior art.

SUMMARY

Aspects of some example embodiments may include an organic light emitting display device capable of decreasing power consumption of a high dynamic range image.

Aspects of some example embodiments may include a driving method of the organic light emitting display device capable of decreasing power consumption of a high dynamic range image.

According to some example embodiments, an organic light emitting display device may include a display panel including a plurality of pixels, a power provider configured to provide a high power voltage and a low power voltage to the pixels, a data driver configured to provide a data signal to the pixels through data lines, a scan driver configured to provide a scan signal to the pixels through scan lines, a timing controller configured to provide control signals that control the power provider, the data driver, and the scan driver, and an image processor configured to receive a high dynamic range (HDR) image signal by every frame, calculate an on-pixel ratio (OPR) that represents a ratio of the number of the on-pixels that turn on based on the high dynamic range image signal to the number of all pixels included in the display panel, and control a brightness of the on-pixel based on the on-pixel ratio.

In some example embodiments, the brightness of the on-pixel in the high dynamic range image signal may increase as the on-pixel ratio decreases.

In some example embodiments, the image processor may include an on-pixel ratio calculator configured to calculate the on-pixel ratio, a power voltage controller configured to control the power provider based on the on-pixel ratio, and a gamma controller configured to control the gamma data set output from the timing controller based on the on-pixel ratio.

In some example embodiments, the power voltage controller may output a power voltage control signal that decreases the high power voltage provided to the pixels to the power provider when the on-pixel ratio is equal to or less than a predetermined reference ratio.

In some example embodiments, the power voltage controller may output a power voltage control signal that increases the low power voltage provided to the pixels to the power provider when the on-pixel ratio is equal to or less than a predetermined reference ratio.

In some example embodiments, the gamma controller may output a gamma control signal that selects one of gamma data sets stored in the timing controller to the timing controller when the on-pixel ratio is equal to or less than a predetermined reference ratio.

In some example embodiments, the data driver may generate gamma voltages based on the gamma data set.

In some example embodiments, the image processor may further include a smooth filter configured to sequentially change the high power voltage during a plurality of frames based on a change amount of the high power voltage between the frames.

In some example embodiments, the image processor further may include a smooth filter configured to sequentially change the low power voltage during a plurality of frames based on a change amount of the low power voltage between the frames.

In some example embodiments, the image processor may further include a smooth filter configured to sequentially output a plurality of gamma data sets during the plurality of frames based on the gamma data sets between the frames.

In some example embodiments, the image processor further may include a scaling unit configured to change a grayscale value of the high dynamic range image signal.

According to some example embodiments, an organic light emitting display device may include a display panel including a plurality of pixels, a power provider configured to provide a high power voltage and a low power voltage to the pixels, a data driver configured to provide a data signal to the pixels through data lines, a scan driver configured to provide a scan signal to the pixels through scan lines, a timing controller configured to generate control signal that control the power provider, the data driver, and the scan driver, and store a plurality of gamma data sets, and an image processor configured to receive a high dynamic range image signal, calculate an on-pixel ratio (OPR) that represents a ratio of the number of on-pixels that turns on based on the high dynamic range image signal to the number of all pixels included in the display panel, provide a power control signal that decreases the high power voltage or increases the low power voltage when the on-pixel ratio is equal to or less than a predetermined reference ratio to the power provider, and provide a gamma control signal that changes the gamma data set to the timing controller.

In some example embodiments, the image processor may output the power control signal that sequentially changes the high power voltage during at least two frames when a change amount of the high power voltage of a Nth frame and a (N+1)th frame is equal to or greater than a predetermined reference change amount, where the N is an integer greater than 1.

In some example embodiments, the image processor may output the gamma control signal that sequentially outputs a plurality of gamma data sets during a plurality of frames based on the gamma data of a Nth frame and a (N+1)th frame, where the N is an integer greater than 1.

In some example embodiments, the image processor may change grayscale value of the high dynamic range image signal.

According to some example embodiments, a driving method of the organic light emitting display device may include a step of calculating an on-pixel ratio based on a high dynamic range (HDR) image signal, a step of determining whether the on-pixel ratio is equal to or less than a predetermined reference ratio, and a step of decreasing brightness of the on-pixels that turn on based on the high dynamic range image signal when the on-pixel ratio is equal to or less than the reference ratio.

In some example embodiments, the brightness of the on-pixels may decrease by decreasing a high power voltage provided to a display panel that displays an image based on the high dynamic range image signal.

In some example embodiments, the brightness of the on-pixels may decrease by increasing a low power voltage provided to a display panel that displays an image based on the high dynamic range image signal.

In some example embodiments, the brightness of the on-pixels may decrease by changing gamma voltages provided to the display panel that displays an image based on the high dynamic range image signal.

In some example embodiments, the driving method of the organic light emitting display device may further include a step of changing the brightness of the on-pixels during a plurality of frames in sequence.

Therefore, according to some example embodiments the organic light display device and the driving method of the same may decrease power consumption of the organic light emitting display device that displays the HDR image by receiving the HDR image signal by every frame, calculating the on-pixel ratio based on the HDR image signal, and controlling the brightness of the on-pixel based on the on-pixels ratio.

BRIEF DESCRIPTION OF THE DRAWINGS

Illustrative, non-limiting example embodiments will be more clearly understood from the following detailed description taken in conjunction with the accompanying drawings.

FIGS. 6A through 6C are diagrams illustrating for describing an operation of the organic light emitting display device of FIG. 1.

DETAILED DESCRIPTION

Hereinafter, some aspects of some example embodiments of the present invention will be explained in more detail with reference to the accompanying drawings.

Figure 1:
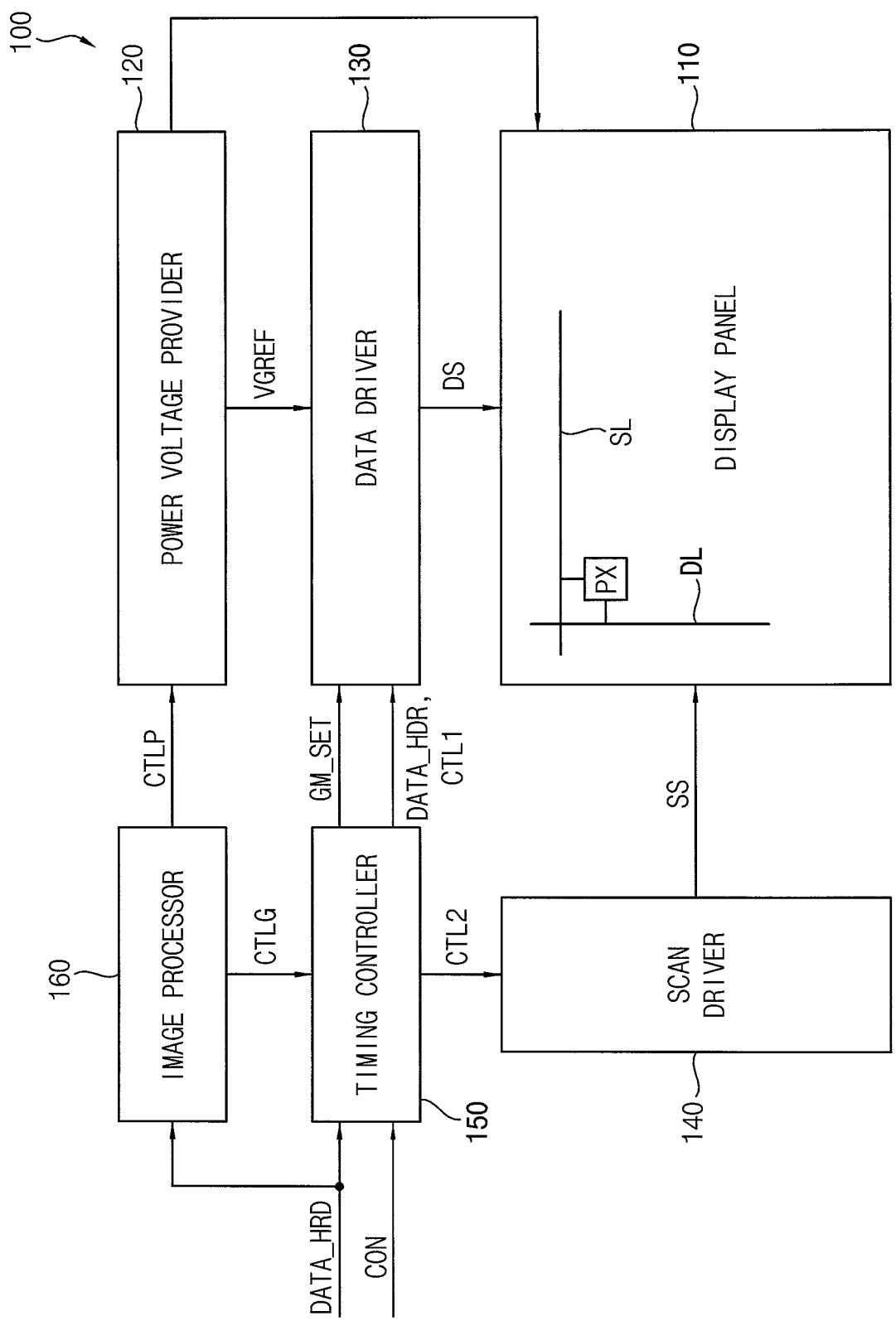
FIG. 1 is a block diagram illustrating an organic light display device according to some example embodiments.
Figure 2:
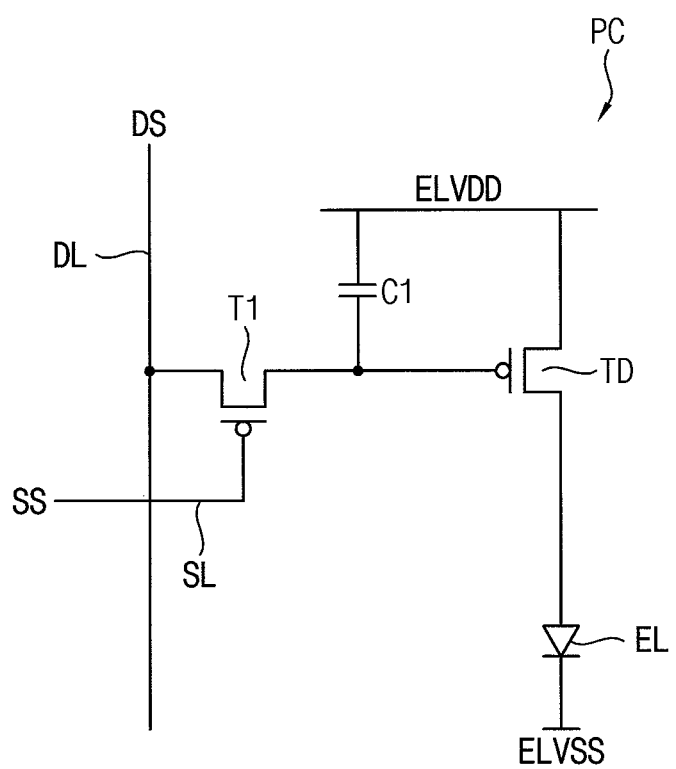
FIG. 2 is a circuit diagram illustrating an example of a pixel included in a display panel of the organic light display device of FIG. 1.

FIG. 1 is a block diagram illustrating an organic light display device according to some example embodiments and FIG. 2 is a circuit diagram illustrating an example of a pixel included in a display panel of the organic light display device of FIG. 1.

Referring to FIG. 1, an organic light emitting display device 100 may include a display panel 110, a power provider (or power source) 120, a data driver 130, a scan driver 140, a timing controller 150, and an image processor 160.

On-pixels that turn on based on a high dynamic range (HDR) image signal may have higher brightness than on-pixels that turn on based on a standard dynamic range (SDR) image signal. For example, a brightness of the on-pixels that turn on based on the SDR image signal may be maximum 600 nit, and a brightness of the on-pixels that turn on based on the HDR image signal may be maximum 1200 nit. Here, the brightness of the on-pixels may increase as the number of the on-pixels decreases. Power consumption of the organic light emitting display device 100 may increase when the HDR image signal is provided to the organic light emitting display device because the image signal of which brightness is high is provided. To overcome this problem, the organic light emitting display device 100 of FIG. 1 may decrease the power consumption by calculating an on-pixel ratio OPR of the HDR image signal DATA_HDR and controlling the brightness of the on-pixels based on the on-pixel ratio when the HDR image is displayed on the organic light emitting device 100. Hereinafter, the organic light emitting display device 100 will be described in more detail.

The display panel 110 may include a plurality of pixels PX. A plurality of first power providing lines, a plurality of second power providing lines, a plurality of data lines DL, and a plurality of scan lines SL may be arranged on the display panel 110. The plurality of pixels PX may be positioned at intersection regions of the data lines DL and the scan lines SL. Each of the pixels PX may be coupled to the first power providing line, the second power providing line, the data line DL, and the scan line SL. Each of the pixels PX may receive a high power voltage ELVDD through the first power providing line and a low power voltage ELVSS through the second power providing line. Each of the pixels PX may receive a data signal DS through the data line DL and a scan signal SS through the scan line SL. Each of the pixels PX may emit light by a driving current generated based on the data signal DS input in response to the scan signal SS.

Referring to FIG. 2, a pixel circuit PC may include an organic light emitting diode EL, a switching transistor T1, a storage capacitor CST, and a driving transistor TD. The switching transistor T1 may turn on in response to the scan signal SS provided through the scan line SL. The data signal DS provided from the data line DL may be stored in the storage capacitor CST as the switching transistor T1 turns on. Here, the data signal DS may be provided during a data writing period through the data line DL. The driving transistor TD may generate the driving current provided to the organic light emitting diode EL based on the data signal DS. The organic light emitting diode EL may emit light based on the driving current.

The power provider 120 may provide the high power voltage ELVDD and the low power voltage ELVSS to the pixels PX. The pixels PX may be driven by the high power voltage ELVDD and the low power voltage ELVSS. The high power voltage ELVDD may be higher than the low power voltage ELVSS. The power provider 120 may change a voltage level of the high power voltage ELVDD or the low power voltage ELVSS based on a power voltage control signal CTLP provided from the image processor 160. Further, the power provider 120 may generate a gamma reference voltage VGREF and provide the gamma reference voltage VGREF to the data driver 130.

The timing controller 150 may convert the HDR image signal DATA_HDR provided from an external device, and generate control signals CTL1, CTL2 that control a driving timing of the converted HDR image data signal DATA_HDR. The timing controller 150 may receive the HDR image signal DATA_HDR from the external device. The timing controller 150 may convert the HDR image signal DATA_HDR by adjusting an algorithm (e.g., dynamic capacitance compensation (DCC)) that compensates display quality of the HDR image signal DATA_HDR. The timing controller 150 may provide the HDR image signal DATA_HDR to the data driver 130 as it is when the timing controller 150 does not include the algorithm that compensates the display quality. The timing controller 150 may receive a control signal CON from the external device. The control signal CON may include a horizontal synchronization signal, a vertical synchronization signal, and a clock signal. The timing controller 150 may generate a horizontal start signal using the horizontal synchronization signal. The timing controller 150 may generate a vertical start signal using the vertical synchronization signal. Further, the timing controller 150 may generate a first clock signal and a second clock signal using the clock signal. The timing controller 150 may provide the horizontal start signal and the first clock signal to the data driver 130 as a first control signal CTL1 and provide the vertical start signal and the second clock signal to the scan driver 140 as a second control signal CTL2. The timing controller 150 may store a plurality of gamma data sets GM_SET. The gamma data sets GM_SET may be implemented as a lookup table (LUT). The timing controller 150 may select one of the gamma data sets GM_SET based on a gamma control signal CTLG and output the selected gamma data set GM_SET to the data driver 130.

The data driver 130 may generate gamma voltages based on the gamma data set GM_SET provided from the timing controller 150 and the gamma reference voltage VGREF provided from the power provider 120. The data driver 130 may generate the data signal DS corresponding to the HDR image signal DATA_HDR based on the gamma voltage, and output the data signal DS to the data line DL of the display panel 110 based on the first control signal CTL1. The data driver 130 may provide the data signal DS to the pixels PX of the display panel 110 in response to the first control signal CTL1 provided to the timing controller 150.

The scan driver 140 may generate the scan signal SS in response to the second control signal CTL2 provided from the timing controller 150 and output the scan signal SS to the scan line SL.

The image processor 160 may receive the HDR image signal DATA_HDR by (or for) every frame, calculate the on-pixel ratio based on the HDR image signal DATA_HDR, and control the brightness of the on-pixel based on the on-pixel ratio. The on-pixel ratio may represent a ratio of the number of on-pixels that turn on based on the HDR image signal DATA_HDR to the number of all pixels in the display panel 110. As described above, the brightness of the on-pixels may increase as the on-pixel ratio decreases because the brightness of the on-pixels increases as the number of the on-pixels decreases.

The image processor of the organic light emitting display device 100 according to some example embodiments may calculate the on-pixel ratio based on the HDR image signal DATA_HDR and control the brightness of the on-pixel when the on-pixel ratio is low. For example, the image processor 160 may output the power voltage control signal CTLP that decreases a voltage level of the high power voltage ELVDD provided to the pixels PX, output the power voltage control signal CTLP that increases a voltage level of the low power voltage ELVSS provided to the pixels PX to the power provider 120, and output the gamma control signal CTLG that selects one of the gamma data set GM_SET to the timing controller 150 when the on-pixel ratio is equal to or less than a reference ratio (e.g., a predetermined reference ratio).

Alternatively, the image processor 160 may simultaneously (e.g., concurrently) perform operations that output the power voltage control signal CTLP that decreases the voltage level of the high power voltage ELVDD or increases the voltage level of the low power voltage ELVSS to the power provider 120 and output the gamma control signal CTLG that changes the gamma data set GM_SET to the timing controller 150. The power provider 120 may decrease the voltage level of the high power voltage ELVDD or increase the voltage level of the low power voltage ELVSS based on the power voltage control signal CTLP. Thus, the brightness of the on-pixels that turn on in the display panel 110 may decrease. The timing controller 150 may output the gamma data set GM_SET to the data driver 130 based on the gamma control signal CTLG, and the data driver 130 may generate the gamma voltages based on the gamma data set GM_SET. The data drier 130 may provide the gamma voltage corresponding to the HDR image data signal DATA_HDR to the display panel 110 as the data signal DS. Thus, the brightness of the on-pixels that turn on in the display panel 110 may decrease. A user may recognize a change of the brightness when the high power voltage ELVDD or the low power voltage ELVSS is rapidly changed. Thus, the image processor 160 may sequentially change the voltage level of the high power voltage ELVDD or the voltage level of the low power voltage ELVSS during a plurality of frames based on a change amount of the high power voltage ELVDD or a change amount of the low power voltage ELVSS between frames. Alternatively, the image processor 160 may compensate a degradation of the display quality that occurred by a rapidly change of the high power voltage ELVDD or the low power voltage ELVSS by changing grayscale value of the HDR image signal DATA_HDR using a scaling factor. Further, the user may recognize the change of the brightness when the gamma voltages are rapidly changed. Thus, the image processor 160 may sequentially output the plurality of gamma data set GM_SET during plurality of frames based on the gamma data set GM_SET between frames. Further, the image processor 160 may use a prior art for decreasing the power consumption when the on-pixel ratio is greater than the reference ratio because a decreasing amount of the brightness is not large. For example, the image processor 160 may decrease the power consumption of the organic light emitting display device 100 by decreasing the brightness of the HDR image signal using an auto current limit (ACL) method when the on-pixel ratio is greater than the reference ratio. As described above, the image process 160 of the organic light emitting display device 100 may decrease the power consumption of the organic light emitting display device 100 by decreasing the brightness of the on-pixel based on the on-pixel ratio.

As described above, the organic light emitting display device 100 of FIG. 1 may decrease the power consumption by receiving the HDR image signal DATA_HDR by (or for) every frame, calculating the on-pixel ratio based on the HDR image signal DATA_HDR, and controlling the brightness of the on-pixel based on the on-pixel ratio.

Figure 3A:
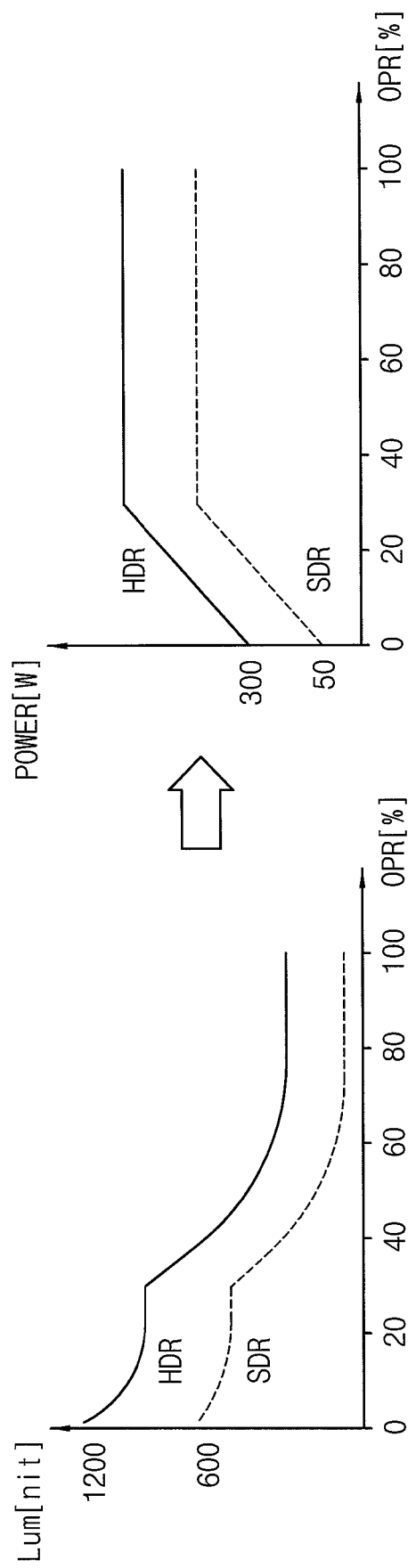
FIGS. 3A and 3B are diagrams illustrating for describing an operation of an image process included in the organic light emitting display device of FIG. 1.
Figure 3B:
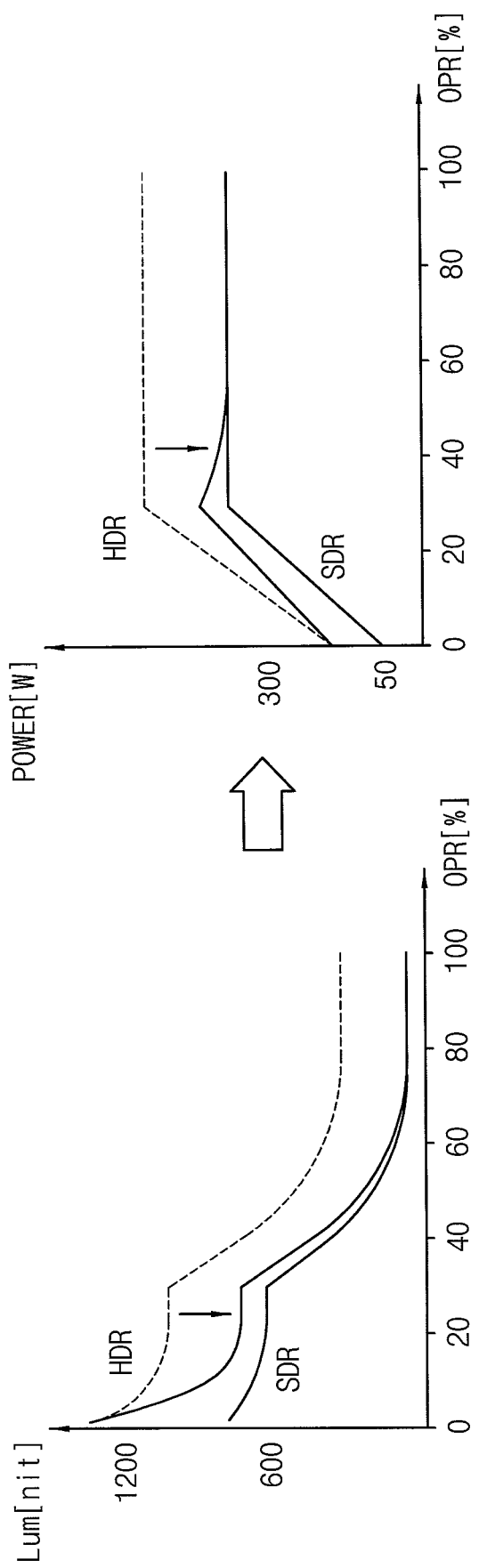

FIGS. 3A and 3B are diagrams illustrating for describing an operation of an image process included in the organic light emitting display device of FIG. 1.

FIG. 3A is a graph that represents a correlation of the on-pixel ratio OPR and the brightness Lum of the on-pixel corresponding to the HDR image signal and the SDR image signal, and a graph that represents a correlation of on-pixels-ratio OPR and the power consumption POWER corresponding to the HDR image signal and the SDR image signal in a prior art. Referring to FIG. 3A, the brightness Lum of HDR image signal is brighter than the brightness Lum of the SDR image signal at the same on-pixel ratio OPR. Further, the power consumption POWER of the HDR image signal is higher than the power consumption POWER of the SDR image signal at the same on-pixel ratio OPR.

FIG. 3B is a graph that represents a correlation of the on-pixel ratio OPR and the brightness Lum of the on-pixel corresponding to the HDR image signal and the SDR image signal, and a graph that represents a correlation of on-pixels-ratio OPR and the power consumption POWER corresponding to the HDR image signal and the SDR image signal in the organic light emitting display device 100 according to example embodiments. Referring to FIG. 3B, the brightness Lum of the on-pixel and the power consumption POWER corresponding to the HDR image signal may decrease. Here, the decreasing amount of the brightness Lum of the on-pixel may increase as the brightness Lum of the on-pixel increases (i.e., as the on-pixel ratio OPR decreases). As described above, the organic light emitting display device 100 according to example embodiments may display a HDR image corresponding to the HDR image data that has a higher contrast ratio than a SDR image and decrease the power consumption by controlling the decreasing amount of the brightness Lum of the on-pixel based on the on-pixel ratio OPR.

Figure 4:
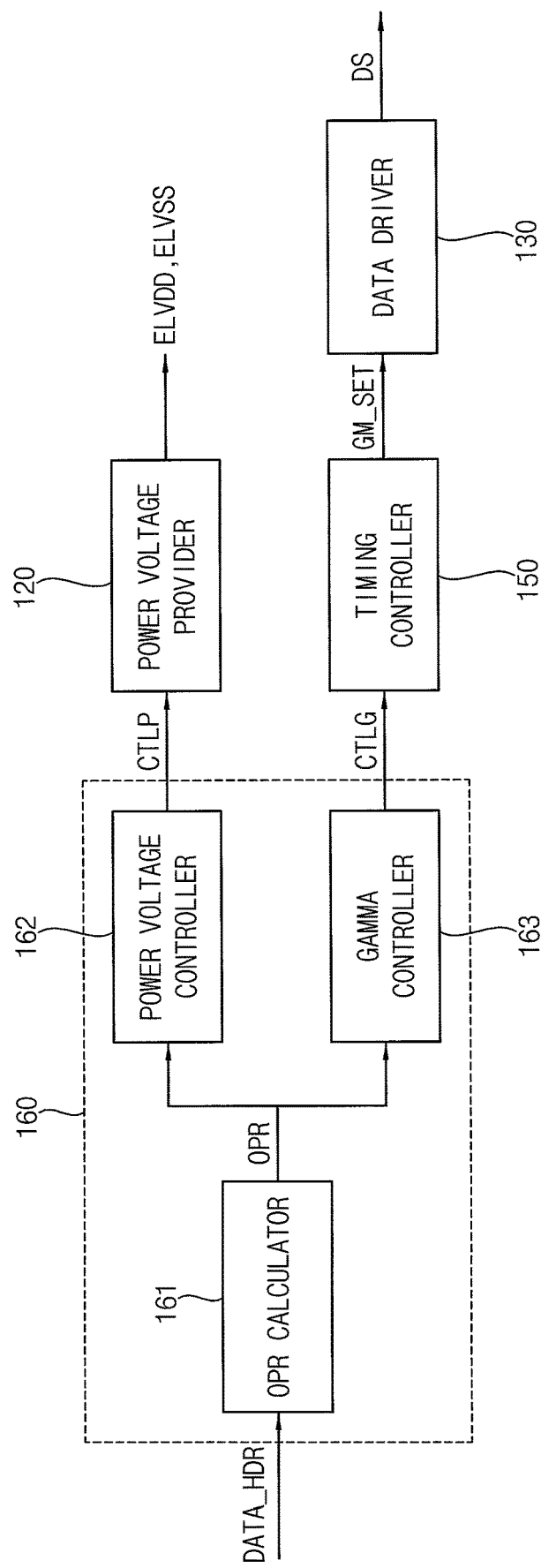
FIG. 4 is a block diagrams illustrating an example of an image processor included in the organic light emitting display device of FIG. 1.

FIG. 4 is a block diagrams illustrating an example of an image processor included in the organic light emitting display device of FIG. 1.

Referring to FIG. 4, the image processor 160 may include an on-pixel ratio calculator 161, a power voltage controller 162, and a gamma controller 163.

The on-pixel ratio calculator 161 may receive the HDR image signal DATA_HDR by every frame. The HDR image signal DATA_HDR may include a red image signal, a green image signal, and a blue image signal. The on-pixel ratio calculator 161 may calculate the on-pixel ratio OPR based on the HDR image signal DATA_HDR. The on-pixel ratio represents a ratio of the number of the on-pixels turns on based on the HDR image signal DATA_HDR to the number of all pixels included in the display panel. The on-pixel ratio calculator 161 may calculate the on-pixel ration OPR of the red image signal, the green image signal, and the blue image signal. The brightness of the on-pixel corresponding to the HDR image signal DATA_HDR may increase as the on-pixel ration OPR decreases.

The power voltage controller 162 may control the power provider 120 based on the on-pixel ratio OPR. The power voltage controller 162 may decrease the brightness of the on-pixel by decreasing the high power voltage ELVDD or increasing the low power voltage ELVSS as the on-pixel ratio OPR decreases because the brightness of the on-pixel increase as the on-pixel ratio OPR decreases. In some example embodiments, the power voltage controller 162 may output the power voltage control signal CTLP that decreases the voltage level of the high power voltage ELVDD provided to the pixels to the power provider 120 when the on-pixels ratio OPR is equal to or less than the reference ratio (e.g., the predetermined reference ratio). The power provider 120 may decrease the voltage level of the high power voltage ELVDD based on the power voltage control signal CTLP.

As described above, the power voltage controller 162 may output the power voltage control signals CTLP that respectively control a voltage level of a red high power voltage, a voltage level of a green high power voltage, and a blue high power voltage when the HDR image signal DATA_HDR includes the red image signal, the green image signal, and the blue image signal, and red high power voltage lines, green high power voltage lines, and the blue high power voltage lines are arranged on the display panel. In other example embodiments, the power voltage controller 162 may output the power voltage control signal CTLP that increase the voltage level of the low power voltage ELVSS provided to the pixels when the on-pixel ratio OPR is equal to or less than the reference ratio (e.g., the predetermined reference ratio).

The power provider 120 may increase the voltage level of the low power voltage ELVSS based on the power voltage control signal CTLP. As described above, the power voltage controller 162 may decrease the brightness of the on-pixel that turn on based on the HDR image signal DATA_HDR by decreasing the voltage level of the high power voltage ELVDD or increasing the voltage level of the low power voltage ELVSS. Here, the reference ratio may be determined by display quality test, etc. As described above, the power voltage controller 162 may output the power voltage control signals CTLP that respectively control a voltage level of a red low power voltage, a voltage level of a green low power voltage, and a blue low power voltage when the HDR image signal DATA_HDR includes the red image signal, the green image signal, and the blue image signal, and red low power voltage lines, green low power voltage lines, and the blue low power voltage lines are arranged on the display panel.

The gamma controller 163 may control the gamma data set GM_SET output from the timing controller 150 based on the on-pixel ratio OPR. The gamma controller 163 may output the gamma control signal CTLG that selects one of the gamma data set GM_SET stored in the timing controller 150 when the on-pixel ratio is equal to or less than the reference ratio (e.g., the predetermined reference ratio). The timing controller 150 may change the gamma data set GM_SET based on the gamma control signal CTLG. For example, the timing controller 150 may change the gamma data set GM_SET having 2.2 gamma value to the gamma data set GM_SET having 2.4 gamma value. The data drier 130 may generate gamma voltages based on the gamma data set GM_SET provided from the timing controller 150. The data driver 130 may output the gamma voltages corresponding to the HDR image signal DATA_HDR as the data signal DS. As described above, the gamma controller 163 may decrease the brightness of the on-pixel by changing the gamma voltages corresponding to the HDR image signal DATA_HDR. Further, the gamma controller 163 may output the gamma control signal CTLG that changes the gamma data set in order to compensate the degradation of the display quality occurred by changing the voltage level of the high power voltage ELVDD and the low power voltage ELVSS in the power voltage controller 162.

As described above, the image processor 160 may control the brightness of the on-pixels that turn on based on the HDR image signal DATA_HDR by including the on-pixel calculator 151 that calculates the on-pixel ratio OPR, the power voltage controller 162 that control the high power voltage ELVDD or the low power voltage ELVSS based on the on-pixel ratio OPR, and the gamma controller 163 that control the gamma data set GM_SET based on the on-pixel ratio OPR.

Figure 5:
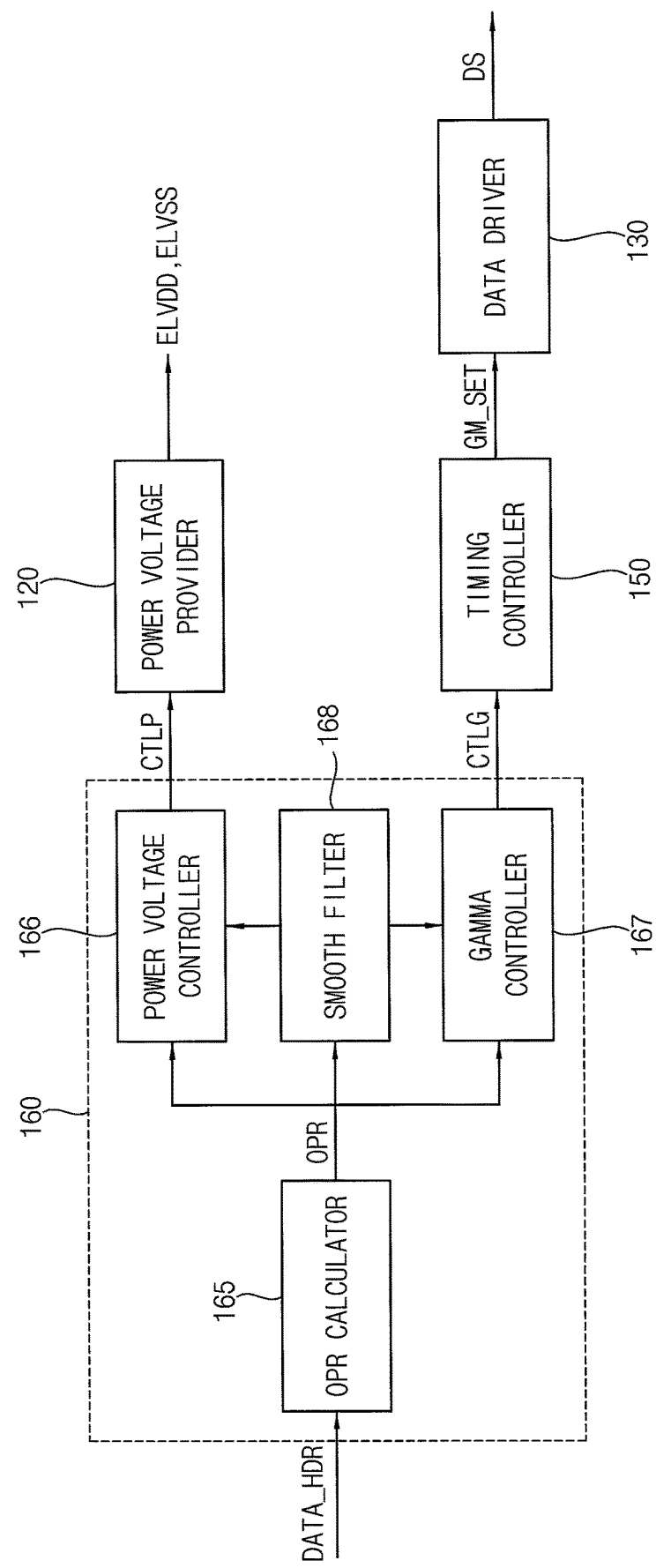
FIG. 5 is a block diagram illustrating other example of an image processor included in the organic light emitting display device of FIG. 1.

FIG. 5 is a block diagram illustrating an example of an image processor included in the organic light emitting display device of FIG. 1.

Referring to FIG. 5, the image processor 160 may include an on-pixel calculator 165, a power voltage controller 166, a gamma controller 167, and a smooth filter 168. The image processor 160 of FIG. 5 may have substantially the same arrangement or functionality as the image processor 160 of FIG. 4 except that the image processor 160 shown in FIG. 5 includes the smooth filter 168.

The smooth filter 168 may sequentially change the high power voltage ELVDD, the low power voltage ELVSS, and the gamma data set GM_SET so that the user does not recognize the rapid brightness change. In some example embodiments, the smooth filter 168 may sequentially change the high power voltage ELVDD during the plurality of frames based on the change amount of the high power voltage ELVDD between frames.

The smooth filter 168 may control the power voltage controller 166 to output the power control signal CTLP that sequentially changes the high power voltage ELVDD during at least two frames when the change amount of the high power voltage ELVDD between an Nth frame and an (N+1)th frame is equal to or greater than a reference change amount (e.g., a predetermined reference change amount), where N is an integer greater than 1. For example, the smooth filter 168 may decrease the voltage level of the high power voltage ELVDD by 0.1V from the Nth frame to the (N+5)th frame when the voltage level of the high power voltage ELVDD of the Nth frame is 8V, the voltage level of the high power voltage ELVDD of the (N+1)th frame is 7.5V, and the reference change amount is 0.3V.

In other example embodiments, the smooth filter 168 may sequentially change the low power voltage ELVSS during the plurality of frames based on the change amount of the low power voltage ELVSS between frames. The smooth filter 168 may control the power voltage controller 166 to output the power control signal CTLP that sequentially changes the low power voltage ELVSS during at least two frames when the change amount of the low power voltage ELVSS between the Nth frame and the (N+1)th frame is equal to or greater than the reference change amount (e.g., the predetermined reference change amount).

In other example embodiments, the smooth filter 168 may sequentially output the plurality of gamma data set GM_SET during the plurality of frames based on the gamma data set GM_SET. The smooth filter 168 may control the power voltage controller 166 to output the power control signal CTLP that sequentially outputs the gamma data set GM_SET based on the gamma data of the Nth frame and the (N+1)th frame. For example, the smooth filter 168 may output the gamma data set GM_SET of which gamma value increases by 0.1 from the Nth frame to the (N+4)th frame when the gamma value of the gamma voltages corresponding to the gamma data set GM_SET of the Nth frame is 2.0, and the gamma value of the gamma voltages corresponding to the gamma data set GM_SET of the (N+1)th frame is 2.4.

Figure 6B:
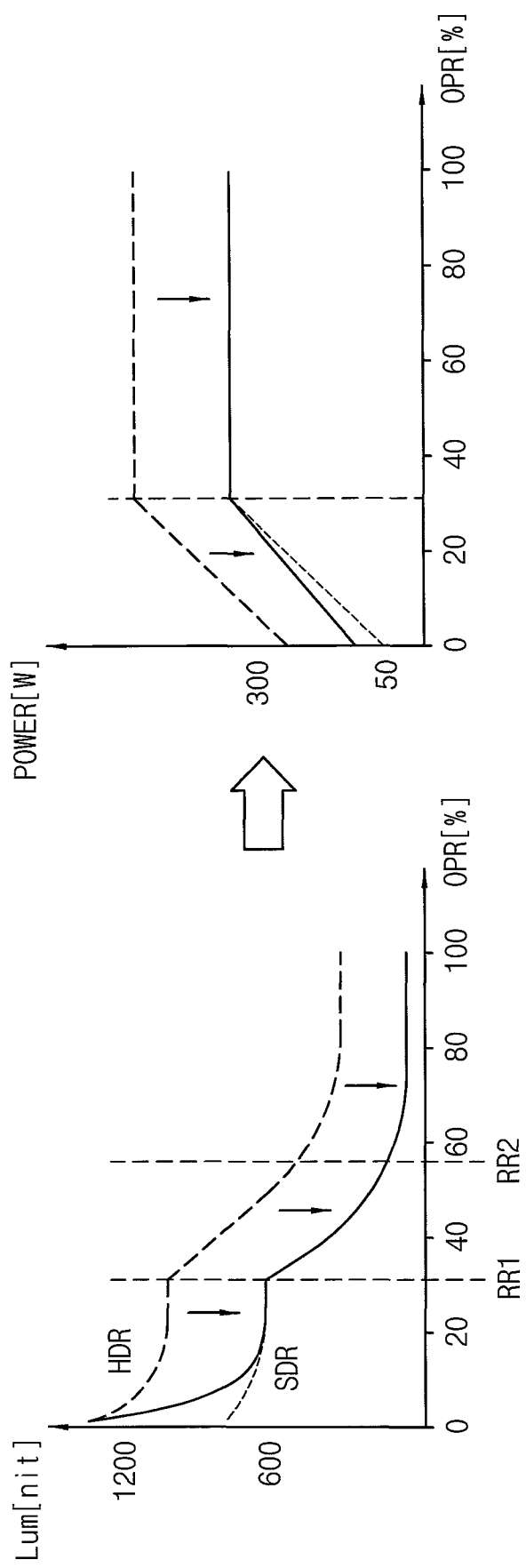
Figure 6C:
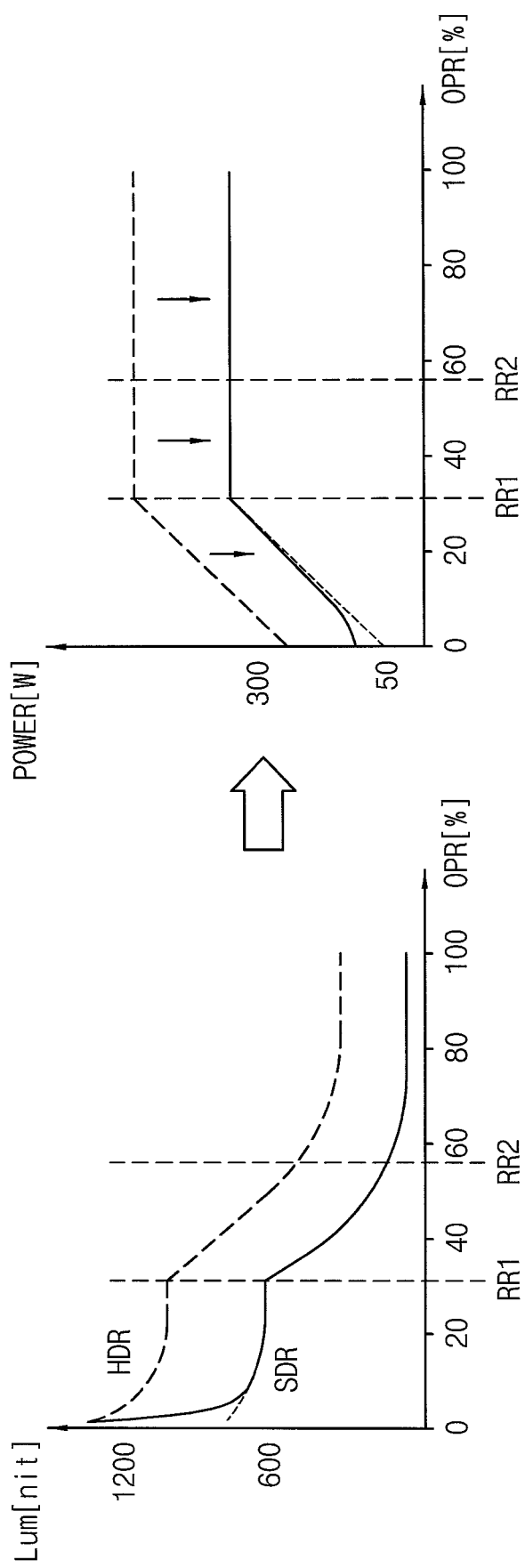

FIGS. 6A through 6C are diagrams illustrating for describing an operation of the organic light emitting display device of FIG. 1.

Referring to FIGS. 6A through 6C, the decreasing amount of the brightness Lum of the on-pixel may be different according to the on-pixel ratio OPR. The organic light emitting display device may increase the decreasing amount of the brightness as the on-pixel ratio OPR decreases because the brightness Lum of the on-pixel increases as the on-pixel ratio OPR decreases. The decreasing amount of the brightness may be determined by a display quality test. The organic light emitting display device may use a different method to decrease the brightness Lum of the on-pixel according to the decreasing amount of the brightness Lum. For example, the image processor of the organic light emitting display device may control the power controller when the brightness Lum of the on-pixel is equal to or less than a first reference ratio RR1. The image processor of the organic light emitting display device may control the gamma controller when the brightness Lum of the on-pixel is greater than the first reference ratio RR1 and equal to or less than a second reference ratio RR2. The image processor of the organic light emitting display device may control the brightness Lum of the on-pixel using the auto current limit method when the brightness Lum of the on-pixel is greater than the second reference ratio RR2.

Referring to FIGS. 6A through 6C, the power consumption of the HDR image data may be similar to the power consumption of the SDR image data when the brightness of the on-pixel according to the on-pixel ratio OPR based on the HDR image data is similar to the brightness Lum of the on-pixel according to the on-pixel ratio OPR based on the SDR image data. In this case, the organic light emitting display device according to example embodiments may have a high contrast ratio comparing to the SDR image by maintaining the high brightness when the on-pixel ratio is low.

Figure 7:
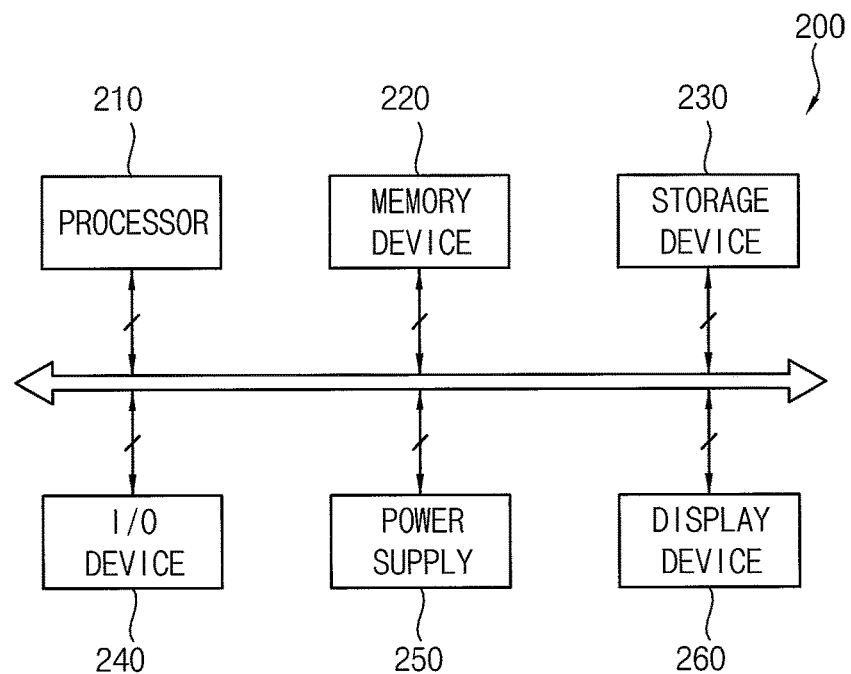
FIG. 7 is a block diagram illustrating an electronic device that includes the organic light emitting display device of FIG. 1.
Figure 8:
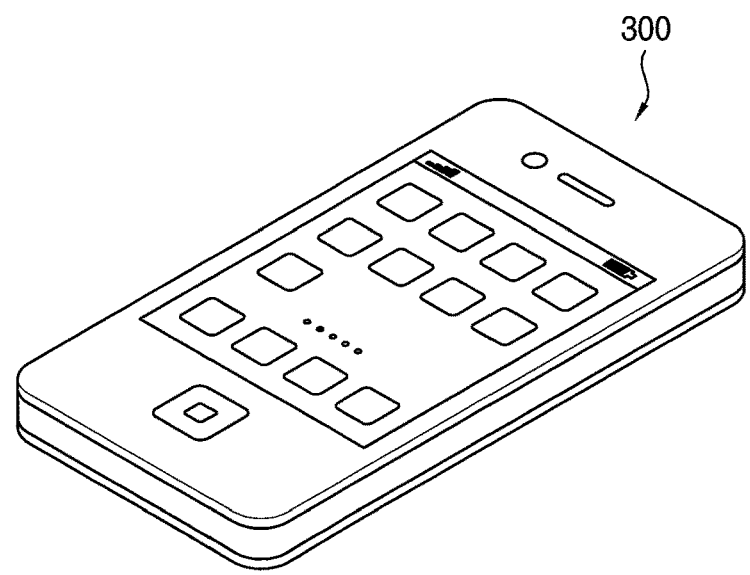
FIG. 8 is a diagram illustrating an example embodiment in which the electronic device of FIG. 7 is implemented as a smart phone.

FIG. 7 is a block diagram illustrating an electronic device that includes the organic light emitting display device of FIG. 1 and FIG. 8 is a diagram illustrating an example embodiment in which the electronic device of FIG. 7 is implemented as a smart phone.

Referring to FIGS. 7 and 8, an electronic device 200 may include a processor 210, a memory device 220, a storage device 230, an input/output (I/O) device 240, a power device 250, and a display device 260. Here, the display device 260 may correspond to the display device 100 of FIG. 1. In addition, the electronic device 200 may further include a plurality of ports for communicating a video card, a sound card, a memory card, a universal serial bus (USB) device, other electronic device, etc. Although it is illustrated in FIG. 8 that the electronic device 200 is implemented as a smart phone 300, a kind of the electronic device 200 is not limited thereto.

The processor 210 may perform various computing functions. The processor 210 may be a microprocessor, a central processing unit (CPU), etc. The processor 210 may be coupled to other components via an address bus, a control bus, a data bus, etc. Further, the processor 210 may be coupled to an extended bus such as surrounded component interconnect (PCI) bus. The memory device 220 may store data for operations of the electronic device 200. For example, the memory device 220 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 230 may be a solid stage drive (SSD) device, a hard disk drive (HDD) device, a CD-ROM device, etc.

The I/O device 240 may be an input device such as a keyboard, a keypad, a touchpad, a touch-screen, a mouse, etc, and an output device such as a printer, a speaker, etc. In some example embodiments, the display device 260 may be included in the I/O device 240. The power device 250 may provide a power for operations of the electronic device 200. The display device 260 may communicate with other components via the buses or other communication links.

As described above, the display device 260 may include a display panel, a power provider, a data driver, a scan driver, a timing controller, and an image processor. The display panel may include a plurality of pixels. The power provider may provide a high power voltage and a low power voltage to the pixels. The pixels may be driven based on the high power voltage and the low power voltage. The power provider may change a voltage level of the high power voltage or the low power voltage based on a power voltage control signal provided from the image processor. The timing controller may convert the HDR image signal provided from the external device and generate control signal that control a driving timing of the converted HDR image signal. Further, the timing controller may store the plurality of gamma data sets. The gamma data sets may be implemented as a lookup table. The timing controller may select one of the gamma data sets based on the gamma control signal provided from the image processor and output to the data driver.

The data driver may generate gamma voltages based on the gamma data set provided from the timing controller and a gamma reference voltage provided from the power provider. The data driver may generate a data signal corresponding to the HDR image signal based on the gamma voltage and output the data signal to data lines of the display panel based on the control signal provided from the timing controller. The scan driver may generate scan signal based on the control signal provided from the timing controller and output the scan signal to scan lines of the display panel.

The image processor may receive the HDR image signal by every frame, calculate the on-pixel ratio based on the HDR image signal, and control the brightness of the on-pixel based on the on-pixel ratio. The image processor may decrease the power consumption by decreasing the brightness of the on-pixel when the on-pixel ratio is equal to or less than the reference ratio (e.g., the predetermined reference ratio) because the brightness of on-pixel increases as the on-pixel ratio decreases. For example, the image processor may output the power voltage control signal that decreases a voltage level of the high power voltage provided to the pixels to the power provider or output the power voltage control signal that increases a voltage level of the low power voltage provided to the pixels to the power provider or output the gamma control signal that select one of the gamma data sets to the timing controller.

Alternatively, the image processor may simultaneously output the power voltage control signal that decreases the voltage level of the voltage level of the high power voltage to the power provider and output the gamma control signal that changes the gamma data set to the timing controller. Further, the image processor may prevent the user to recognize the rapid brightness change by sequentially change the voltage level of the high power voltage and the voltage level of the low power voltage during the plurality of frames based on a change amount of the high power voltage or a change amount of the low power voltage between frames. Further, the image processor may prevent the user to recognize the rapid brightness change by sequentially output the gamma data sets during the plurality of frames based on the gamma data sets between frames.

As described above, the electronic device 200 according to example embodiments may decrease the power consumption of the display device by decreasing the brightness of the on-pixel based on the on-pixel ratio of the HDR image signal.

Figure 9:
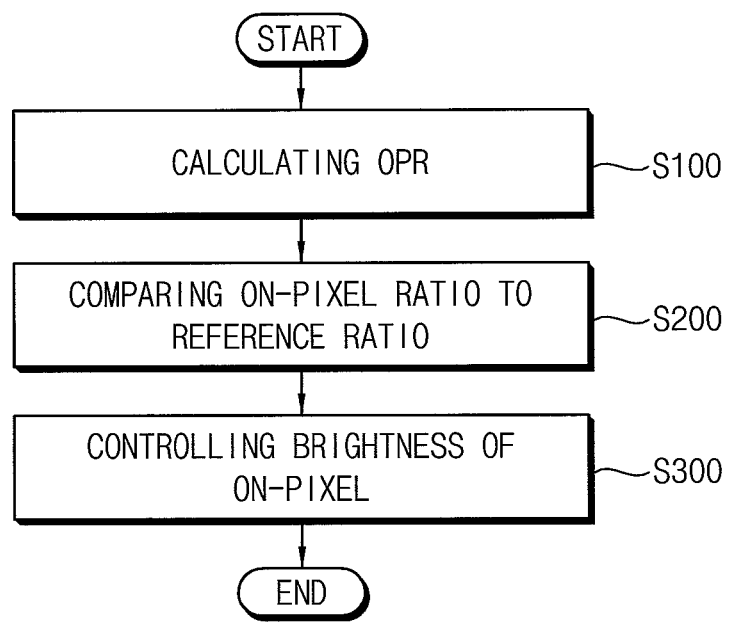
FIG. 9 is a flowchart illustrating a driving method of an organic light emitting display device according to some example embodiments.

FIG. 9 is a flowchart illustrating a driving method of an organic light emitting display device according to an example embodiments.

Referring to FIG. 9, a driving method of an organic light emitting display device according to some example embodiments may include an operation of calculating an on-pixel ratio based on a HDR image signal (at S100), an operation of determining whether the on-pixel ratio is equal to or less than a reference ration (e.g., a predetermined reference ratio) (at S200), and an operation of decreasing a brightness of the on-pixels based on the HDR image signal when the on-pixel ratio is equal to or less than the reference ratio (at S300).

The driving method of the organic light emitting display device may calculate the on-pixel ratio based on the HDR image signal S100. The on-pixel ratio may be a ratio of the number of on-pixels that turn on based on the HDR image signal to the number of all pixels included in the display panel. The brightness of the on-pixel may increase as the on-pixel ration decreases.

The driving method of the organic light emitting display device may determine whether the on-pixel ratio is equal to or less than the reference ratio (e.g., the predetermined reference ratio) (at S200). The reference ratio may be determined by a display quality test.

The driving method of the organic light emitting display device may decrease the brightness of the on-pixels that turn on based on the HDR image signal when the on-pixel ratio is equal to or less than the reference ratio S300. The brightness of the on-pixel may increase as the on-pixel ratio decreases in the HDR image signal. The driving method of the organic light emitting display device may decrease the power consumption by decreasing the brightness of the on-pixel of the HDR image signal having the on-pixel ratio equal to or less than the reference ratio.

In some example embodiments, the driving method of the organic light emitting display device may decrease the brightness of the on-pixels by decreasing the high power voltage provided to the display panel that displays the HDR image signal. In other example embodiments, the driving method of the organic light emitting display device may decrease the brightness of the on-pixels by increasing the low power voltage provided to the display panel that displays the HDR image signal. In other example embodiments, the driving method of the organic light emitting display device may decrease the brightness of the on-pixels by changing gamma voltages provided to the display panel that displays the HDR image signal. Further, the driving method of the organic light emitting display device may further include a step of changing the brightness of the on-pixels in sequence.

The driving method of the organic light emitting display device may sequentially change the brightness of the on-pixel in order to the user does not recognize the brightness change when the brightness of the on-pixels are rapidly changed. In some example embodiments, the driving method of the organic light emitting display method may sequentially change the high power voltage during at least two frames when the change amount of the high power voltage of the Nth frame and the (N+1)th frame is equal to or greater than the reference change amount (e.g., the predetermined reference change amount).

In other example embodiments, the driving method of the organic light emitting display device may sequentially change the low power voltage during at least two frames when the change amount of the low power voltage of the Nth frame and the (N+1)th frame is equal to or greater than the reference change amount (e.g., the predetermined reference change amount). In other example embodiments, the driving method of the organic light emitting display device may sequentially output the plurality of gamma data sets during the plurality of frames based on the gamma data of the Nth frame and the (N+1)th frame.

As described above, the driving method of the organic light emitting display device may decrease the power consumption by calculating the on-pixel ratio based on the HDR image signal, determining whether the on-pixel ratio is equal to or less than the reference ratio, and decreasing the brightness of the on-pixels that turn on based on the HDR image signal when the on-pixel ratio is equal to or less than the reference ratio.

Aspects of some example embodiments may be applied to a display device and an electronic device having the display device. For example, aspects of some example embodiments may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and aspects of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and their equivalents.

What is claimed is:

1. An organic light emitting display device comprising:
   a display panel including a plurality of pixels;
   a power source configured to provide a high power voltage and a low power voltage to the pixels;
   a data driver configured to provide a data signal to the pixels through data lines;
   a scan driver configured to provide a scan signal to the pixels through scan lines;
   a timing controller configured to provide control signals that control the power source, the data driver, and the scan driver; and
   an image processor configured to receive a high dynamic range (HDR) image signal by every frame, calculate an on-pixel ratio (OPR) that represents a ratio of a number of all on-pixels, from among the plurality of pixels, that turn on based on the HDR image signal to a number of all pixels, including pixels that do not turn on, of the plurality of pixels included in the display panel, and control a brightness of the on-pixels that turn on based on the on-pixel ratio.

2. The organic light emitting display device of claim 1, wherein the brightness of the pixels that turn on based on the HDR image signal increases as the OPR decreases.

3. The organic light emitting display device of claim 1, wherein the image processor includes:
   an OPR calculator configured to calculate the OPR;
   a power voltage controller configured to control the power source based on the OPR; and
   a gamma controller configured to control a gamma data set output from the timing controller based on the OPR.

4. The organic light emitting display device of claim 3, wherein the power voltage controller is configured to output a power voltage control signal that decreases the high power voltage provided to the pixels from the power source when the OPR is equal to or less than a predetermined reference ratio.

5. The organic light emitting display device of claim 3, wherein the power voltage controller is configured to output a power voltage control signal that increases the low power voltage provided to the pixels from the power source when the OPR is equal to or less than a predetermined reference ratio.

6. The organic light emitting display device of claim 3, wherein the gamma controller is configured to output a gamma control signal that selects one of gamma data sets stored in the timing controller to the timing controller when the OPR is equal to or less than a predetermined reference ratio.

7. The organic light emitting display device of claim 6, wherein the data driver is configured to generate gamma voltages based on the one of the gamma data sets.

8. The organic light emitting display device of claim 3, wherein the image processor further includes:
   a smooth filter configured to sequentially change the high power voltage during a plurality of frames based on a change amount of the high power voltage between the frames.

9. The organic light emitting display device of claim 3, wherein the image processor further includes:
   a smooth filter configured to sequentially change the low power voltage during a plurality of frames based on a change amount of the low power voltage between the frames.

10. The organic light emitting display device of claim 8, wherein the image processor further includes:
    a smooth filter configured to sequentially output a plurality of gamma data sets during the plurality of frames based on the gamma data sets between the frames.

11. The organic light emitting display device of claim 3, wherein the image processor further includes:
    a scaling unit configured to change a grayscale value of the HDR image signal.

12. An organic light emitting display device, comprising:
    a display panel including a plurality of pixels;
    a power source configured to provide a high power voltage and a low power voltage to the pixels;
    a data driver configured to provide a data signal to the pixels through data lines;
    a scan driver configured to provide a scan signal to the pixels through scan lines;
    a timing controller configured to generate a control signal that controls the power source, the data driver, and the scan driver, and to store a plurality of gamma data sets; and
    an image processor configured to receive a high dynamic range image signal, calculate an on-pixel ratio (OPR) that represents a ratio of a number of all on-pixels, from among the plurality of pixels, that turn on based on the high dynamic range image signal to a number of all pixels, including pixels that do not turn on, of the plurality of pixels included in the display panel, provide a power control signal that decreases the high power voltage or increases the low power voltage when the on-pixel ratio is equal to or less than a predetermined reference ratio to the power source, and provide a gamma control signal that selects a gamma data set from among the gamma data sets to the timing controller.

13. The organic light emitting display device of claim 12, wherein the image processor is configured to output the power control signal that sequentially changes the high power voltage during at least two frames when a change amount of the high power voltage of a Nth frame and a (N+1)th frame is equal to or greater than a predetermined reference change amount, where N is an integer greater than 1.

14. The organic light emitting display device of claim 12, wherein the image processor is configured to output the gamma control signal that sequentially outputs a plurality of gamma data sets during a plurality of frames based on gamma data of a Nth frame and a (N+1)th frame, where N is an integer greater than 1.

15. The organic light emitting display device of claim 12, wherein the image processor is configured to change grayscale value of the high dynamic range image signal.

16. A driving method of an organic light emitting display device, comprising:
    calculating an on-pixel ratio based on a high dynamic range (HDR) image signal, the on-pixel ratio being a ratio of a number of all on-pixels from among a plurality of pixels that turn on based on the HDR image signal to a number of all pixels, including pixels that do not turn on, of the plurality of pixels included in a display panel;
    determining whether or not the on-pixel ratio is equal to or less than a predetermined reference ratio; and
    decreasing brightness of the on-pixels that turn on based on the HDR image signal in response to the on-pixel ratio being equal to or less than the predetermined reference ratio.

17. The driving method of claim 16, wherein the brightness of the pixels that turn on based on the HDR image signal decreases by decreasing a high power voltage provided to the display panel that displays an image based on the HDR image signal.

18. The driving method of claim 16, wherein the brightness of the pixels that turn on based on the HDR image signal decreases by increasing a low power voltage provided to the display panel that displays an image based on the HDR image signal.

19. The driving method of claim 16, wherein the brightness of the pixels that turn on based on the HDR image signal decreases by changing gamma voltages provided to the display panel that displays an image based on the HDR image signal.

20. The driving method of claim 16, further comprising:
    changing the brightness of the pixels that turn on based on the HDR image signal during a plurality of frames in sequence.

* * * * *